(12) United States Patent   (10) Patent No.: US 7,095,096 B1
Mostafazadeh                (45) Date of Patent: Aug. 22, 2006

(54) MICROARRAY LEAD FRAME (75) Inventor: Shahram Mostafazadeh, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 17 days.

(21) Appl. No.: 10/919,592

(22) Filed: Aug. 16, 2004

(51) Int. Cl.
    *H01L 23/495* (2006.01)
(52) U.S. Cl. ...................... 257/666; 257/676
(58) Field of Classification Search ........... 257/666, 257/676, 784, 787
    See application file for complete search history.

(56) References Cited

U.S. PATENT DOCUMENTS

| | | |
|---|---|---|
| 5,075,760 A | 12/1991 | Nakashima et al. |
| 5,585,195 A | 12/1996 | Shimada |
| 5,656,550 A | 8/1997 | Tsuji et al. |
| 5,719,440 A | 2/1998 | Moden |
| 5,759,874 A | 6/1998 | Okawa |
| 5,830,800 A | 11/1998 | Lin |
| 5,847,458 A | 12/1998 | Nakamura et al. |
| 5,866,948 A | 2/1999 | Murakami et al. |
| 5,895,234 A | 4/1999 | Taniguchi et al. |
| 5,923,080 A | 7/1999 | Chun |
| 5,998,875 A | 12/1999 | Bodo et al. |
| 6,034,422 A | 3/2000 | Horita et al. |
| 6,100,594 A | 8/2000 | Fukui et al. |
| 6,130,473 A | 10/2000 | Mostafazadeh et al. |
| 6,157,080 A | 12/2000 | Tamaki et al. |
| 6,177,288 B1 | 1/2001 | Takiar |
| 6,238,952 B1 | 5/2001 | Lin |
| 6,247,229 B1 | 6/2001 | Glenn |
| 6,255,740 B1 | 7/2001 | Tsuji et al. |
| 6,258,626 B1 | 7/2001 | Wang et al. |
| 6,261,864 B1 | 7/2001 | Jung et al. |
| 6,306,684 B1 | 10/2001 | Richardson et al. |
| 6,306,685 B1 | 10/2001 | Liu et al. |
| 6,307,755 B1 | 10/2001 | Williams et al. |
| 6,316,837 B1 | 11/2001 | Song |
| 6,333,252 B1 | 12/2001 | Jung et al. |
| 6,342,730 B1 | 1/2002 | Jung et al. |
| 6,355,507 B1 | 3/2002 | Fanworth |
| 6,358,778 B1 | 3/2002 | Shinohara |
| 6,372,539 B1 | 4/2002 | Bayan et al. |
| 6,451,627 B1 | 9/2002 | Coffman |
| 6,683,368 B1 | 1/2004 | Mostafazadeh |
| 6,689,640 B1 | 2/2004 | Mostafazadeh |

(Continued)

*Primary Examiner*—S. V. Clark
(74) *Attorney, Agent, or Firm*—Beyer Weaver & Thomas, LLP (57) ABSTRACT

Processes for packaging integrated circuits in microarray packages are described. In a method aspect of the invention, a first side of a metal sheet is etched to define a lead frame panel having a plurality of device areas. Each device area includes an array of contact posts suitable for forming contact pads and a plurality of lead traces. Each lead trace is coupled to an associated contact pad. The etching is arranged so that it does not etch all of the way through the metal sheet. Rather, the etching thins portions of the lead frame panel apart from the contact posts and lead traces to form a thin connecting sheet that holds the contact posts and lead traces in place. With this arrangement, the contact posts and lead traces defined in the resulting lead frame structure are held in place by the thin connecting sheet and are raised relative to the connecting sheet. The resulting etched lead-frame panel is particularly well suited for use in microarray packages. In various embodiments, other lead frame structures may be incorporated into the device areas as desired.

15 Claims, 7 Drawing Sheets

U.S. PATENT DOCUMENTS 6,740,961 B1 * 5/2004 Mostafazadeh ............. 257/676
6,762,511 B1    7/2004 Satsu et al.
6,812,552 B1 * 11/2004 Islam et al. ................. 257/666
6,967,125 B1 * 11/2005 Fee et al. ................... 438/112
6,975,022 B1 * 12/2005 Sakamoto et al. .......... 257/676
7,001,798 B1 *  2/2006 Yamaguchi ................ 438/114

* cited by examiner

MICROARRAY LEAD FRAME

BACKGROUND

The present invention relates generally to the packaging of integrated circuits in leadframe based microarray packages.

Figure 1:
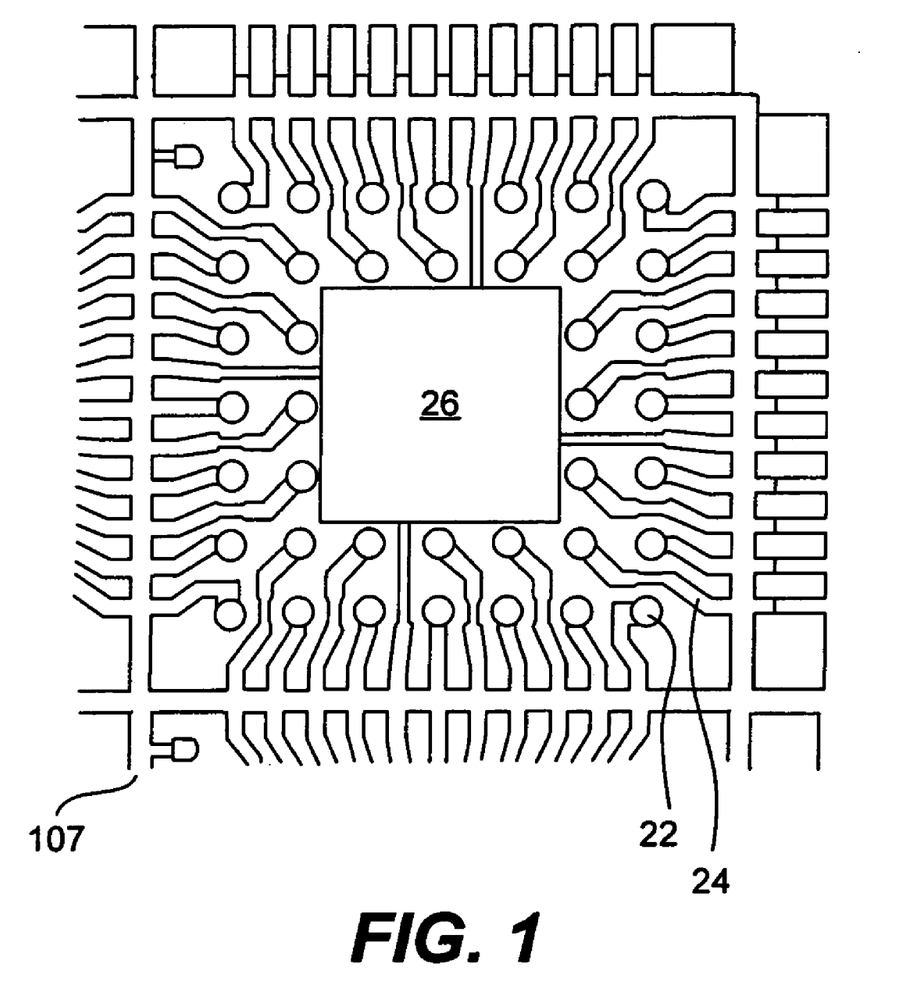
FIG. 1 is a diagrammatic top view of a conventional microarray leadframe.

There are a number of conventional processes for packaging integrated circuits. Many packaging techniques use a leadframe that has been stamped or etched from a metal (typically copper) sheet to provide electrical interconnects to external devices. One relatively recently developed packaging style, which is sometimes referred to as a leadframe based microarray package is generally illustrated in FIG. 1. In a microarray package, the leadframe typically includes an array of contact posts 22 that are exposed on the bottom surface of the package and lead traces 24 that may or may not be exposed at the bottom surface of the package. A die mounted on the lead frame is wire bonded (or otherwise electrically connected) to the lead traces, which serve as electrical connectors between the bonding wires and the contact posts 22. Often the microarray package will also have a die support structure 26 that supports the die.

Microarray packages have a number of potential advantages. For example, they are relatively low cost, they may be configured to be pin compatible with conventional BGA packages and they allow a relatively large number of contacts for a given package size. Also, since the lead traces permit "routing" of signals to contact pads located under the die, a package with a relatively smaller footprint may be used for a given die size and pin count as compared to many other leadframe based packages.

Given their many advantages, microarray packages in general have recently generated a great deal of interest within the semiconductor industry. Although existing techniques for fabricating microarray leadframes and for packaging integrated circuits using microarray leadframe technology work well, there are continuing efforts to develop even more efficient designs and methods for packaging integrated circuits using microarray leadframe technology.

SUMMARY

To achieve the foregoing and other objects of the invention improved arrangements and processes for packaging integrated circuits in microarray packages are described. In a method aspect of the invention, a first side of a metal sheet is etched to define a lead frame panel having a plurality of device areas. Each device area includes an array of contact posts suitable for forming contact pads and a plurality of lead traces. Each lead trace is coupled to an associated contact pad. The etching is arranged so that it does not etch all of the way through the metal sheet. Rather, the etching thins portions of the lead frame panel apart from the contact posts and lead traces to form a thin connecting sheet that holds the contact posts and lead traces in place. With this arrangement, the contact posts and lead traces defined in the resulting lead frame structure are held in place by the thin connecting sheet and are raised relative to the connecting sheet.

The resulting etched leadframe panel is particularly well suited for use in microarray packages. In various embodiments, other lead frame structures may be incorporated into the device areas as desired. For example, the device areas may also includes die support structures such as die attach pads and/or die support risers. In other embodiments, they may include power/ground bars or other desired contact structures. The panel may be arranged to include one or more two dimensional arrays of immediately adjacent device areas.

To package integrated circuits using the described leadframe panel, dice are attached to the panel, with each die being mounted on an associated device area. Generally, it is expected (but not required) that the die will cover some, but not all of the contact posts. Once the dice are mounted on the leadframe panel, they may be electrically coupled to the lead frame using wire bonding or other suitable techniques. Contact posts that are not covered by the die may be electrically connected by directly wire bonding to the contact posts. Contact posts that are covered by the die may be electrically connected to the die by wire bonding to their associated lead traces, which are designed to extend outward to a region that is not covered by the die. The electrically connected dice are then encapsulated with the connecting sheet still in place using traditional encapsulation techniques. After encapsulation the connecting sheet is etched away leaving at least the contact posts exposed at the bottom surface of the encapsulant.

In some embodiments, the resulting microarray packages have a novel structure because they do not have any portions of the lead frames exposed on the side surfaces of the resulting package.

BRIEF DESCRIPTION OF THE DRAWINGS

The invention, together with further objects and advantages thereof, may best be understood by reference to the following description taken in conjunction with the accompanying drawings in which.

DETAILED DESCRIPTION OF PREFERRED EMBODIMENTS

Figure 2A:
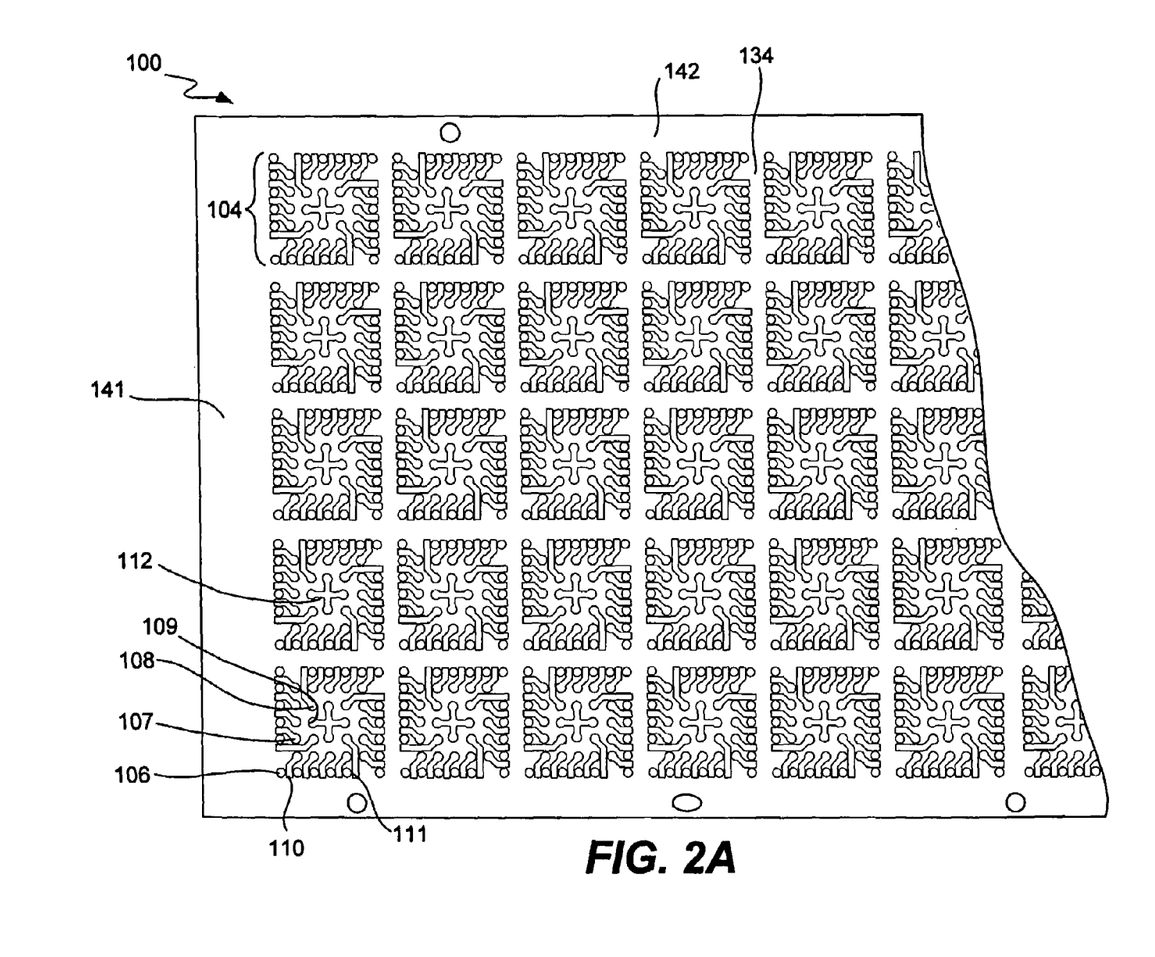
FIG. 2(a) is a diagrammatic top view of a leadframe panel in accordance with one embodiment of the present invention.
Figure 2B:
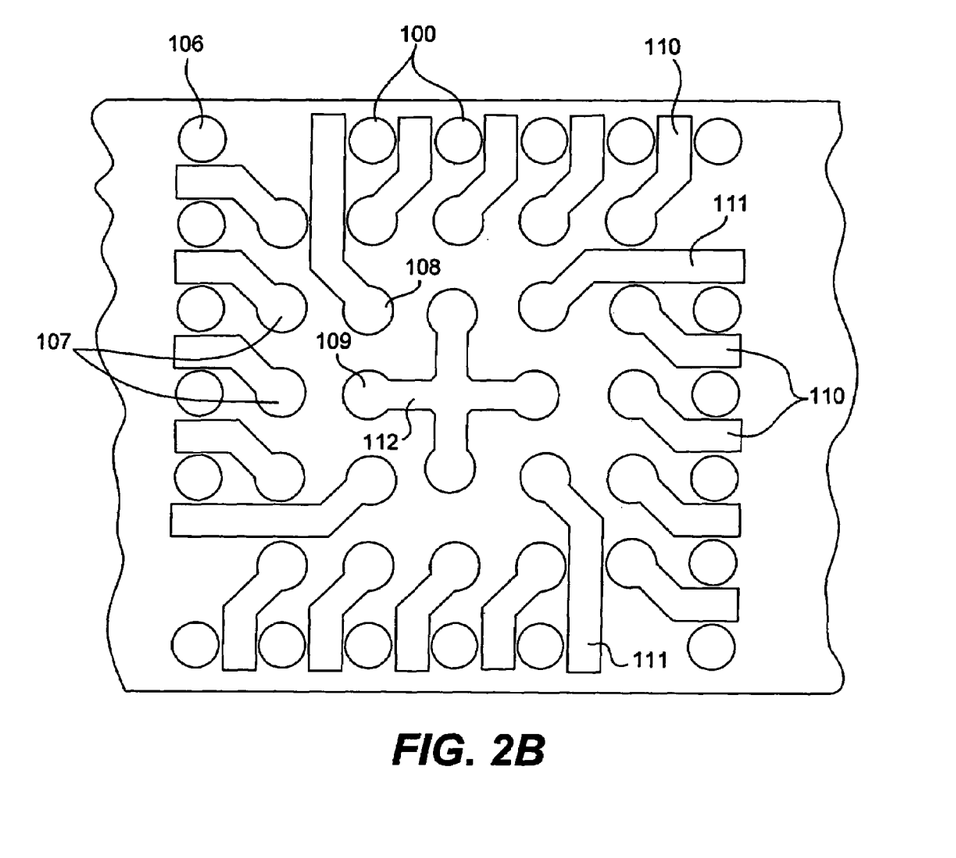
FIG. 2(b) is a diagrammatic top view of single device area from the leadframe panel of FIG. 2(a)

Referring initially to FIG. 2(a), a leadframe panel 100 in accordance with one embodiment of the present invention will be described. The leadframe panel 100 is patterned to define a two dimensional array of device areas 104. As best seen in FIG. 2(b), each device area 104 includes a number of contact posts 106–109, a number of lead traces 110, 111 and a die support structure 112. The contact posts illustrated in FIG. 2 are arranged in a fully populated grid array having three rows (in the context of this discussion a "row" extends along all four sides of the device). Of course, the size of the grid array can be widely varied depending upon the needs of a particular application and as will be appreciated by those familiar with the art, some of the grid (as for example some of the interior rows) may not be populated or may be replaced by a die support structure such as a die attach pad.

The contact posts 106 in the outer row of the array are free standing. That is, they are not connected to any lead traces. The contact posts 107 in the middle row are all connected to relatively short lead traces 110 that extend towards the outer periphery of the device area 104 such that the ends of the lead traces 110 are positioned between adjacent contact posts 106 in the outer row. Some of the contacts posts 108 in the inner row are connected to slightly longer lead traces 111 that pass between contact posts in the middle row and also extend towards the outer periphery of the device area such that their ends are also positioned between adjacent contact posts in the outer row. Other contact posts 109 in the inner row are part of the die support structure 112, which in the illustrated embodiment takes the form of a cross.

In other embodiments a variety of other layouts and structures may be used within the device areas. For example, in larger devices, it might be desirable to provide two or more rows of freestanding contacts pads. In the illustrated embodiment, only one lead trace is routed between any adjacent pair of contact posts. However, in other implementations it may be desirable or necessary to route two (or more) lead traces between adjacent contact posts. Additionally, a wide variety of die attach structures and geometries can be provided. In some embodiment, it may be desirable to couple the die attach structure to one or more lead traces so that the die attach structure can be used as a ground or power plane. In other embodiments, bus bars or other larger structures may be included as part of the device areas as well.

Figure 3A:
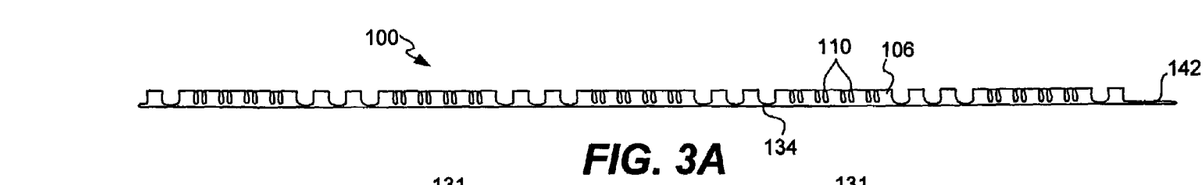
FIG. 3(a) is a diagrammatic side view of a segment of the leadframe panel illustrated in FIG. 2(a) taken along line 3—3 of FIG. 2(a)

The leadframe panel 100 is fabricated by etching the top surface of a blank leadframe panel to define the desired structures. The etching is preferably controlled so that it etches through most, but not all of the blank. Thus, as best illustrated in FIG. 3(a), the etched lead frame includes a thin connecting sheet 134 having a number of raised features (i.e., the contact posts, lead traces, die attach structures, etc.) integrally formed thereon. It should be appreciated that the use of the connecting sheet approach eliminates the need for the use of tie bars and/or other structures to support the various lead frame features. Eliminating the tie bars and various other supporting structures potentially permits the device areas to be packed more tightly on the leadframe panel.

The thickness of the connecting sheet can be widely varied. Generally, it is desirable for the connecting sheet to be thick enough so that the leadframe panel 100 is self-supporting so that it can be handled throughout the fabrication and packaging processes without sustaining undue damage. By way of example, on leadframes formed from copper or copper alloy blanks, an overall leadframe thickness in the range of 4–8 mils, with a connecting sheet thickness on the order of 1 to 3 mils works well. Of course thicker connecting sheets and/or leadframes can always be used. However, thicker connecting sheet require that more material must be removed when the connecting sheet is sacrificed and thus, it is often desirable to utilize generally thinner connecting sheets.

Figure 5:
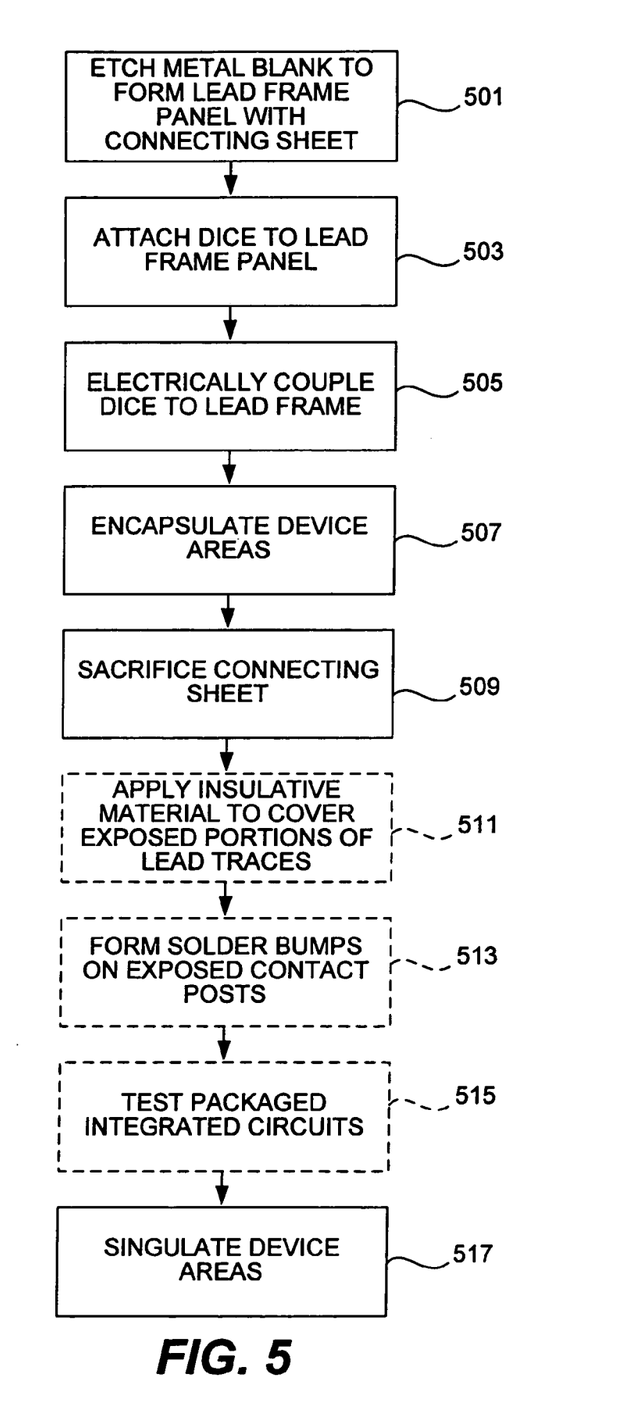
FIG. 5 is a flow chart illustrating a method of packaging an integrated circuit in accordance with one embodiment of the present invention.

Referring next to FIG. 3 in conjunction with FIG. 5 a method of packaging integrated circuits in accordance with one embodiment of the invention will be described. Initially, in step 501, a suitable metal blank is etched as described above to form a lead frame panel having the desired features on a thin connecting sheet. One such leadframe panel is diagrammatically illustrated in FIG. 3(a). A die 131 may then be attached to each device area as illustrated in FIG. 3(b) using conventional die attach techniques. Step 503. By way of example an adhesive paste or an adhesive tape can be used to secure the dice to the lead frame. It is noted that in the illustrated embodiment, relatively large dice are provided such that each die covers all of the contact posts other than those in the outer row. However, it should be appreciated that in other embodiments, both the size of the dice and their relative positioning within the device area may be widely varied. The described structure can also be used in multi-chip packages that place two or more integrated circuit die within each device area.

Figure 3B:
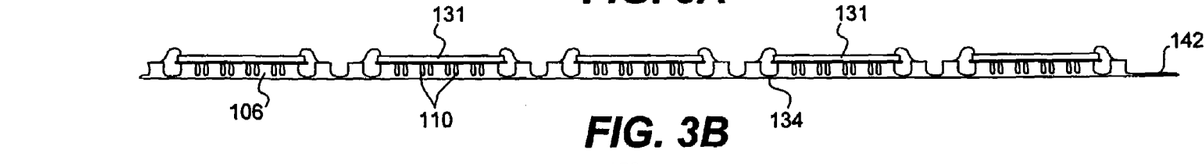
FIG. 3(b) is a diagrammatic side view of the leadframe illustrated in FIG. 3(a) after a die has been mounted thereon and electrically connected to the leadframe.

The dice may be electrically connected to their associated lead traces and contact posts using conventional techniques such as wire bonding. Step 505. Wire bonding can (and typically would) be done directly on contact posts that are not covered by the dice. Contact posts that are covered by the die may be electrically connected to the die by wire bonding to their associated lead traces. Of course, when appropriate, other electrical connection techniques can be used as well. For example, if the die has active connectors (such as a ground electrode) on the backside of the die, such connectors may be directly connected to any appropriate underlying lead frame features. In the illustrated embodiment, bonding wires 139 are used to electrically connect the die to the various contact posts and lead traces.

Figure 3C:
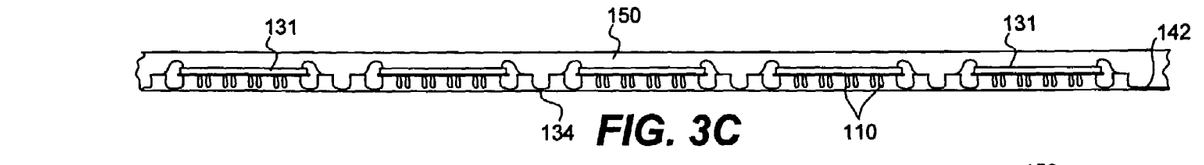
FIG. 3(c) is a diagrammatic side view of the leadframe illustrated in FIG. 3(b) after encapsulation.
Figures 3D, 3E:
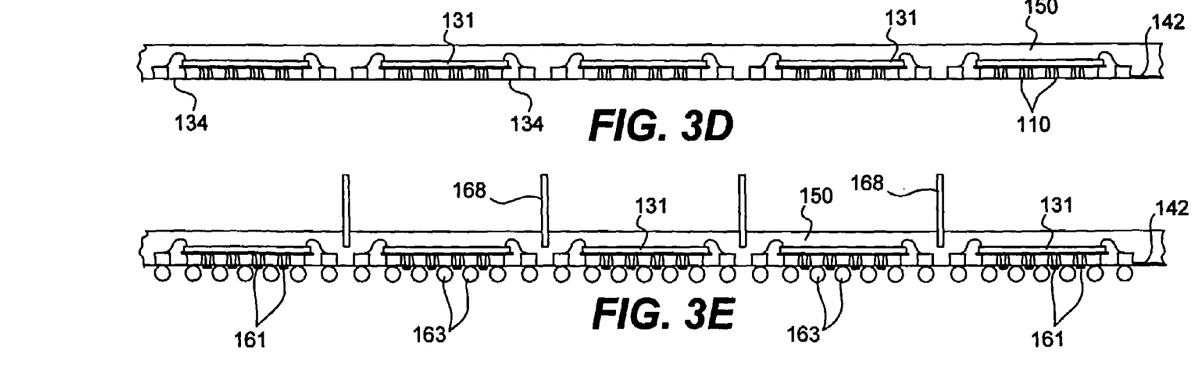
FIG. 3(d) is a diagrammatic side view of the leadframe illustrated in FIG. 3(c) after removal of the connecting sheet.
FIG. 3(e) is a diagrammatic side view of the leadframe illustrated in FIG. 3(d) with solder balls attached to the contact posts and an electrical insulation layer applied to the lead traces.

After the dice have been attached and electrically connected to the lead frame panel, the device areas are encapsulated as best illustrated in FIG. 3(c). Step 507. A wide variety of standard encapsulation techniques may be used to encapsulate the device areas. In the illustrated embodiment, an encapsulant cap 150 is molded over the entire two-dimensional array of device areas. However, a variety of other known encapsulations techniques such as topping, screen printing, or stencil printing may be used to encapsulate the device areas. Generally, it is desirable for the encapsulant to cover all of the device areas so that when the connecting sheet is later sacrificed, the encapsulant material holds all of the devices together. However, in other embodiments, the device areas could be individually molded (e.g., by using a mold having an array of cavities that are designed to match the device areas), or group molded in several different blocks (e.g., with each block having a two dimensional array of device areas).

Encapsulant material that overlies etched regions of the lead frame panel that are outside of the device areas (e.g. molding material overlying side and end regions 141, 142 of the lead frame panel as illustrated in 2(a)) can be used to facilitate handling of the panels after the connecting sheet has been sacrificed. Of course, the leadframe panel can be designed to incorporate spaces between or adjacent selected device areas as appropriate to create any handling features that are desired on the encapsulated panel.

After the panel has been encapsulated, the connecting sheet is sacrificed. Step 509. It should be appreciated that after the connecting sheet has been removed, the encapsulant provides the structural support that holds the device areas together. The connecting sheet may be removed by any suitable technique, including grinding or etching. Since the connecting sheet has a uniform thickness it is relatively easy to control the amount of material being removed. Additionally, it should be appreciated that when etching is used, the metal etches away relatively consistently, with the encapsulant material effectively acting as an etch stop.

In some implementations, it may be desirable to recess the contact posts and/or lead traces slightly with respect to bottom surface of the encapsulant. This can be accomplished by slightly over-etching the connecting sheet. When an over-etch is used, the exposed portions of the contact posts and lead traces will continue to etch away after the connecting sheet has been fully removed, thereby recessing these structures as much as desired. The depth of any desired recess can be relatively precisely controlled by controlling the etch parameters.

Once the connecting sheet has been sacrificed, then nay other panel level processing that is desired may be done. The optional panel level processing may vary widely based on the desired nature of the finalized products. For example, it may be desirable to electrically insulate the exposed lead traces, metalize the contact posts, bump the panel and/or test the packaged devices. After the connecting sheet has been sacrificed, the lead traces will remain exposed at the bottom surface of the packages. In many situations, it may be desirable to apply an electrically insulative material 161 to the exposed portions of the lead traces so that they are not exposed in the finished product and do not corrode. Step 511. This is often helpful so that solder does not inadvertently bridge between a lead trace and an adjacent contact pad when the package is attached for use.

It is also often desirable to form solder bumps 163 on each of the contact posts (i.e., bump the devices) while still in panel form. Step 513. This provides devices that look very similar to conventional BGA or other grid array type packages. Often the leadframe will be formed from a material such as copper that corrodes when exposed to ambient air and/or does not adhere well to certain solders. Therefore, as will be appreciated by those familiar with packaging in general, in some situations, it may also be desirable to plate the contact posts by applying one or more metallization layers onto the contact posts. The plating may take the form of an underbump metallization stack, or more tradition lead plating.

One particularly noticeable feature of the described panel is that after the connecting sheet has been removed, the device areas are typically not electrically connected. Therefore, they may be tested in panel form, (Step 515) which is advantageous from a cost standpoint.

Figure 4:
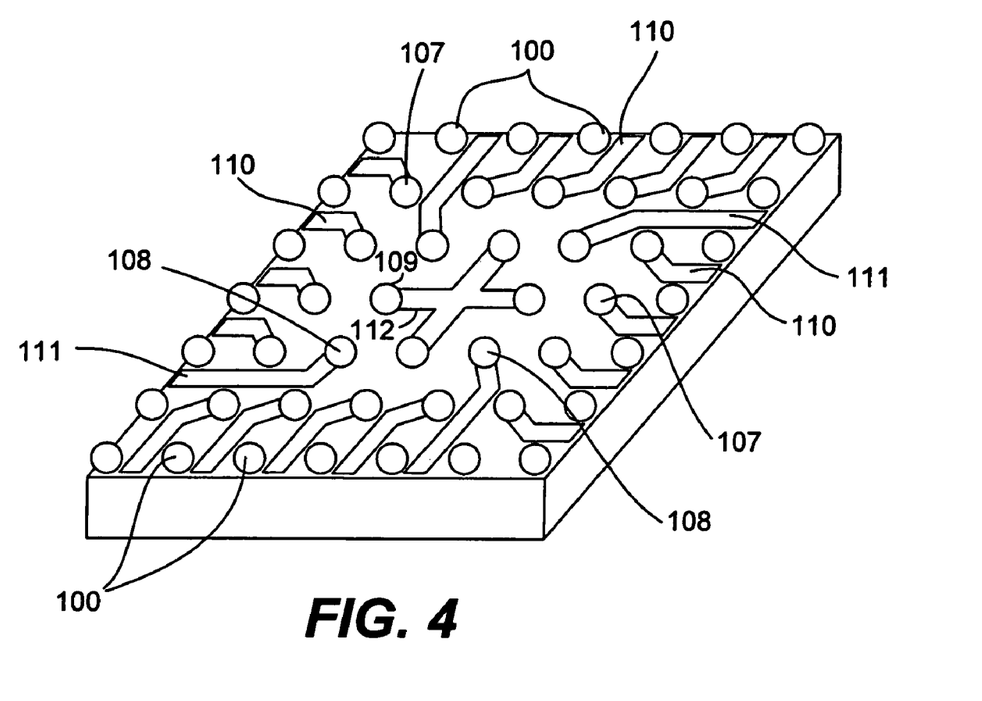
FIG. 4 is a diagrammatic perspective view of a microarray package in accordance with one embodiment of the present invention.

After all of the panel level processing has been completed, the panel may be cut in order to singulate the individual packaged devices as diagrammatically illustrated in FIG. 3(*e*). Step 517. A variety of different cutting techniques can be used, as for example, sawing, laser cutting, etc. In the embodiment illustrated in FIG. 3(*e*), gang cutters having a plurality of saw blades 168 are used. It should be appreciated that with the primary described embodiment, there is no metal along the cutting lines between adjacent device areas after the connecting sheet has been sacrificed. Therefore, only the relative soft encapsulant material needs to be cut through, which can help improve blade life of the saws used to separate the different packages when compared to the singulation of conventional leadframe based packages. It also makes the panel especially well adapted for laser cutting since there is not any metal that needs to be cut through. A representative completed package is illustrated in FIG. 4. After the packages have been separated, any desired device level processing and/or testing may be performed and the packaging process is complete.

Although only a few embodiments of the invention have been described in detail, it should be appreciated that the invention may be implemented in many other forms without departing from the spirit or scope of the invention. Although specific leadframe features have been described (such as contact posts, lead traces, and die attach structures), it should be appreciated that a wide variety of leadframe structures can be created using the described connecting sheet approach. The described etching based approach can be used to produce leadframe features having virtually any desired footprint. Thus, the geometry of the contact posts and other structures may be varied as appropriate for a particular application. For example, in the illustrated embodiments, the contact posts have a substantially round footprint. However, in other embodiments, alternative cross section geometries, such as square, rectangular or oval footprints may be formed.

Figure 6A:
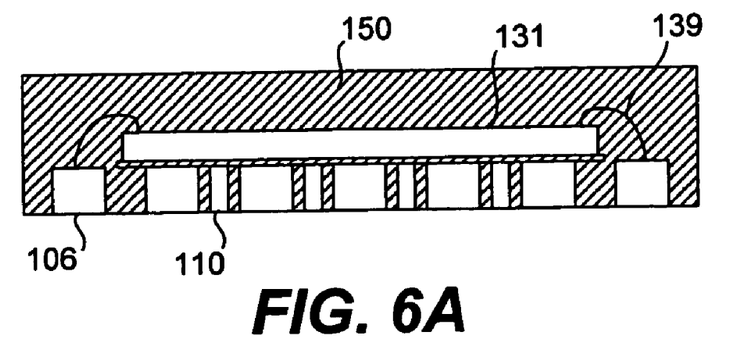
FIGS. 6(a)–6(c) are diagrammatic side views of various packages formed using the present invention.
Figure 6B:
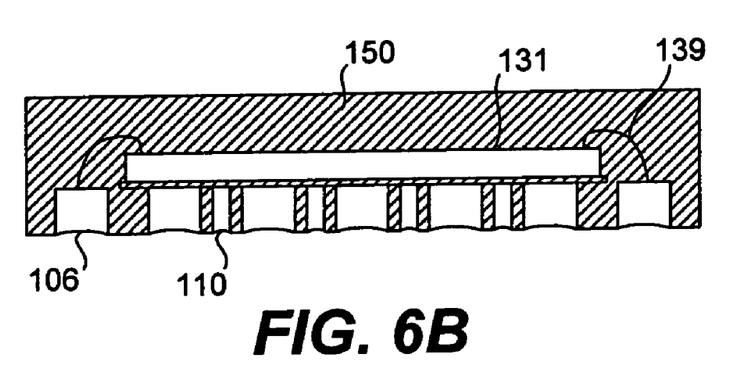
Figure 6C:
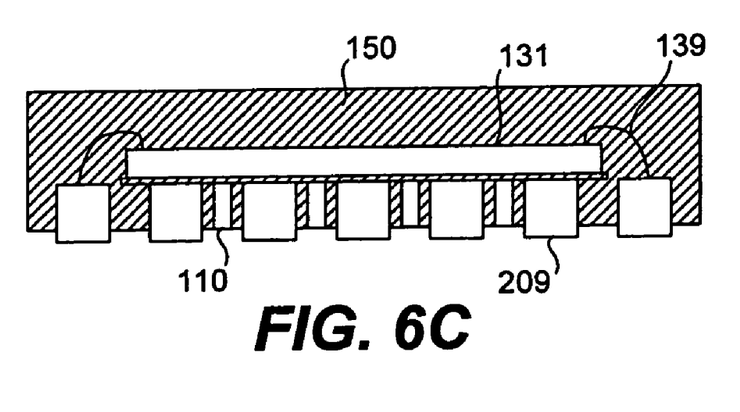

In the primary described embodiment, after the encapsulation, the connecting sheet is sacrificed (e.g. by grinding or etching) in a manner that causes the contact posts and lead traces to be substantially co-planar with the bottom surface of the encapsulant as illustrated in FIG. 6(*a*). In other embodiments, the lead frame panel can be slightly over-etched to for contact posts and lead traces that appear recessed slightly (or by any desired amount) into the encapsulant as illustrated in FIG. 6(*b*). These arrangement have the advantage of not requiring any masking of the lead frame panel prior to etching, since the etchant can be chosen so that the encapsulant acts as an etch stop. In still other embodiments, a masked etch could be used to cause the contact posts 209 to extend below the bottom surface of the encapsulant while etching leaving the lead traces to be co-planar or recess with respect to the bottom surface of the encapsulant as illustrated in FIG. 6(*c*). This can readily be done by masking the portions of the connecting sheet above the contact posts. Therefore, the present embodiments are to be considered as illustrative and not restrictive and the invention is not to be limited to the details given herein, but may be modified within the scope of the appended claims.

The invention claimed is:

1. A leadframe panel suitable for use in forming a multiplicity of microarray packages, the leadframe panel comprising:

a plurality of device areas, each device area including an array of contact posts suitable for forming external contact pads in a microarray package and a plurality of lead traces, the contact posts being arranged in a plurality of rows and each lead trace being coupled to an associated contact post, wherein upper surfaces of the contact posts and lead traces are substantially co-planar with an upper surface of the leadframe panel; and a thin, substantially uniform, solid, conductive connecting sheet integrally formed with the contact posts and the lead traces such that the contact posts and the lead traces rise above the connecting sheet, wherein a bottom surface of the connecting sheet is substantially co-planar with a lower surface of the leadframe panel and the contact posts, lead traces and connecting sheet are formed from a unitary structure; and wherein each device area is configured suitably to support an associated die, whereby the associated die may be electrically connected to selected contact posts underlying the die by electrically connecting the die to lead traces associated with the selected contact posts; and wherein the connecting sheet is arranged such that the connecting sheet can prevent molding material applied over selected device areas from penetrating the connecting sheet in a region below the selected device areas.

2. A leadframe panel as recited in claim 1 wherein the device areas are arranged into at least one two dimensional array of immediately adjacent device areas.

3. A leadframe panel as recited in claim 1 wherein each device area further comprises a die support structure.

4. A leadframe panel as recited in claim 3 wherein the die support structure includes a die attach pad that is integrally formed with the connecting sheet and that rises above the connecting sheet.

5. A leadframe panel as recited in claim 3 wherein the die support structure includes at least one riser integrally formed with the connecting sheet and that rises above the connecting sheet.

6. A panel for use in packaging integrated circuits, the pad comprising:
   a leadframe panel as recited in claim 1;
   a plurality of dice, each die being adhered to the leadframe panel in an associated device area;
   a plurality of connectors for electrically connecting each die to the lead traces in the die's associated device area; and
   an encapsulant that covers at least one device area.

7. A panel as recited in claim 1 wherein at least some adjacent pairs of contact posts have two or more lead traces passing therebetween.

8. A microarray package comprising:
   a leadframe having an array of contact posts exposed at a bottom surface of the microarray package and a plurality of lead traces, the contact posts being arranged in a plurality of rows and each lead trace being coupled to an associated contact post;
   a die carried by the lead frame;
   a plurality of bonding wires that electrically connect the die to the lead frame, wherein some of the bonding wires are directly connected to associated contact posts that do not underlie the die and some of the bonding wires are directly connected to selected lead traces that are associated with contact posts that underlie the die, such that the selected lead traces electrically connect their associated bonding wires to their associated contact posts, whereby the die may be electrically connected to selected contact posts underlying the die; and
   an encapsulant that encapsulates the die, the bonding wire and the leadframe while leaving the contact posts exposed on the bottom surface of the microarray package without leaving any portion of the leadframe exposed on a side or top portion of the microarray package such that the contact posts form electrical contacts for the microarray package.

9. A microarray package as recited in claim 8 wherein bottom surfaces of the lead traces are exposed at the bottom surface of the encapsulant, the package further comprising an insulating material that covers the lead traces to electrically insulate the lead traces.

10. A microarray package as recited in claim 8 wherein the exposed contact posts protrude beyond the bottom surface of the encapsulant.

11. A microarray package as recited in claim 8 wherein the exposed contact posts are substantially coplanar with the bottom surface of the encapsulant.

12. A microarray package as recited in claim 8 wherein the exposed contact posts are recessed relative to the bottom surface of the encapsulant.

13. A microarray package as recited in claim 12 further comprising a plurality of solder bumps, each solder bump being formed on an associated contact post.

14. A microarray package as recited in claim 8 wherein each device area further comprises a die support structure.

15. A microarray package as recited in claim 8 wherein at least some adjacent pairs of contact posts have two or more lead traces passing therebetween.

* * * * *

UNITED STATES PATENT AND TRADEMARK OFFICE
CERTIFICATE OF CORRECTION

PATENT NO. : 7,095,096 B1 Page 1 of 1
APPLICATION NO. : 10/919592
DATED : August 22, 2006
INVENTOR(S) : Shahram Mostafazadeh It is certified that error appears in the above-identified patent and that said Letters Patent is hereby corrected as shown below:

Column 5, line 18, change "nay" to --any--.

Column 5, line 61, change "relative" to --relativity--.

In line 1 of claim 6 (column 7, line 21) change "pad" to --panel--.

Signed and Sealed this

Seventeenth Day of April, 2007

JON W. DUDAS
*Director of the United States Patent and Trademark Office*